United States Patent
Yasuda

(10) Patent No.: US 8,008,124 B2
(45) Date of Patent: Aug. 30, 2011

(54) ADHESIVE FILM FOR SEMICONDUCTOR AND SEMICONDUCTOR DEVICE USING THE ADHESIVE FILM

(75) Inventor: Hiroyuki Yasuda, Tokyo (JP)

(73) Assignee: Sumitomo Bakelite Co., Ltd., Tokyo (JP)

( * ) Notice: Subject to any disclaimer, the term of this patent is extended or adjusted under 35 U.S.C. 154(b) by 99 days.

(21) Appl. No.: 12/526,265

(22) PCT Filed: Feb. 26, 2008

(86) PCT No.: PCT/JP2008/000343
§ 371 (c)(1),
(2), (4) Date: Aug. 7, 2009

(87) PCT Pub. No.: WO2008/105169
PCT Pub. Date: Sep. 4, 2008

(65) Prior Publication Data
US 2010/0320620 A1  Dec. 23, 2010

(30) Foreign Application Priority Data
Feb. 28, 2007 (JP) .................. 2007-048497

(51) Int. Cl.
*H01L 21/00* (2006.01)
(52) U.S. Cl. ........ 438/108; 438/118; 257/782; 257/789; 257/E21.506; 257/E23.119; 522/182
(58) Field of Classification Search .......... 257/782–789, 257/E21.506, 23.119, 124; 438/109, 118, 438/121; 428/210, 354; 522/182; 523/400, 523/439
See application file for complete search history.

(56) References Cited

U.S. PATENT DOCUMENTS

| | | | |
|---|---|---|---|
| 5,753,362 A * | 5/1998 | Kawase et al. | 428/327 |
| 6,413,620 B1 * | 7/2002 | Kimura et al. | 428/210 |
| 6,438,281 B1 * | 8/2002 | Tsukamoto et al. | 385/14 |
| 6,774,501 B2 * | 8/2004 | Kurafuchi et al. | 257/788 |
| 7,364,221 B2 * | 4/2008 | Tahri et al. | 296/187.02 |
| 2003/0069331 A1 | 4/2003 | Teiichi et al. | |
| 2006/0226525 A1 | 10/2006 | Osuga et al. | |

(Continued)

FOREIGN PATENT DOCUMENTS

CN  1244606 C  3/2006

(Continued)

OTHER PUBLICATIONS

Extended European Search Report for the corresponding European patent application No. 08710496.4-1214/ 2117041. May 3, 2010.

(Continued)

*Primary Examiner* — Michael Lebentritt
(74) *Attorney, Agent, or Firm* — Ditthavong Mori & Steiner, P.C.

(57) ABSTRACT

An adhesive film for a semiconductor containing an (A) ester (meth)acrylate copolymer and a (B) thermoplastic resin other than the ester (meth)acrylate copolymer, and composed so as to satisfy the following formula (1) for two hours from 10 minutes after starting measurement, in which γ represents an amount of shearing strain produced upon undergoing a shearing stress of 3000 Pa at a frequency of 1 Hz and a temperature of 175° C. on parallel plates of 20 mm in diameter, exhibits superior filling performance in surface unevenness of a substrate through an encapsulating material sealing process, despite that semiconductor chips are stacked in multiple layers in the semiconductor device and hence a wire bonding process imposes a longer thermal history.

$$0.10 \leq \gamma \leq 0.30 \quad (1)$$

11 Claims, 3 Drawing Sheets

U.S. PATENT DOCUMENTS

| | | | |
|---|---|---|---|
| 2008/0138618 A1* | 6/2008 | Sasaki et al. | 428/345 |
| 2008/0176969 A1* | 7/2008 | Tahri et al. | 521/99 |
| 2010/0055842 A1* | 3/2010 | Sugo et al. | 438/118 |
| 2010/0206623 A1* | 8/2010 | Kawate et al. | 174/259 |
| 2010/0255299 A1* | 10/2010 | Kawashima et al. | 428/354 |

FOREIGN PATENT DOCUMENTS

| | | |
|---|---|---|
| JP | 10-330441 | 12/1998 |
| JP | 11-012545 | 1/1999 |
| JP | 2001-220571 | 8/2001 |
| JP | 2002-138270 | 5/2002 |
| JP | 2005-054140 | 3/2005 |
| JP | 2006-073982 | 3/2006 |
| JP | 2006-213872 | 8/2006 |
| JP | 2006-225567 | 8/2006 |
| JP | 2006-232985 | 9/2006 |
| JP | 2006-237465 | 9/2006 |
| WO | WO 01/81495 | 11/2001 |

OTHER PUBLICATIONS

Office Action issued by the State Intellectual Property Office of the People's Republic of China for corresponding CN Application No. 200880006547.5, Jun. 11, 2010.

* cited by examiner

ADHESIVE FILM FOR SEMICONDUCTOR AND SEMICONDUCTOR DEVICE USING THE ADHESIVE FILM

TECHNICAL FIELD

The present invention relates to an adhesive film and to a semiconductor device including the adhesive film, and more particularly to an adhesive film to be used for bonding semiconductor chips.

BACKGROUND ART

Recently, the progress in functions of electronic apparatuses has been creating a greater demand for higher density and higher integration level of semiconductor devices, thus promoting the increase in capacity and density of semiconductor packages.

To satisfy such demand, studies are being made, for example, on the technique of stacking a semiconductor chip on another semiconductor chip in multiple layers, to thereby reduce the size and thickness of the semiconductor package and to increase the capacity thereof. Such package generally employs an organic substrate such as a bismaleimide-triazine substrate or a polyimide substrate (patent document 1).

According to the patent document 1, the semiconductor package primarily employs a film-type adhesive for bonding the semiconductor chip and the organic substrate, or the semiconductor chips each other, because it is difficult to apply a proper amount of a conventional paste-type adhesive such that the adhesive is not squeezed out from the semiconductor chip.

In addition, conventional techniques related to the film-type adhesive can be found in patent documents 2 to 4.

The patent document 2 teaches employing an adhesive film constituted of an epoxy resin and acrylic rubber for bonding the semiconductor chip and an interconnect substrate.

The patent document 3 teaches employing an adhesive film predominantly constituted of a phenoxy resin for bonding the semiconductor chip and the interconnect substrate.

The patent document 4 teaches adjusting a minimum viscosity of an adhesive tape at the bonding temperature in a specific range, so as to control the fluidity.

[Patent document 1] JP-A No. 2006-73982
[Patent document 2] JP-A No. 2001-220571
[Patent document 3] JP-A No. 2002-138270
[Patent document 4] JP-A No. H11-12545

The conventional techniques according to the foregoing documents, however, still have a room for improvement in the following aspects.

In the case of bonding the interconnect substrate and the semiconductor chip, since a metal interconnect is provided on the surface of the interconnect substrate and a solder resist covers the surface, the presence of regions where the metal interconnect is present and where it is absent forms unevenness on the surface of the interconnect substrate. The conventional adhesive film for semiconductor is not always capable of properly filling the unevenness upon bonding the semiconductor chip and the interconnect substrate, and a void may be left between the interconnect substrate and the semiconductor chip, which may degrade the reliability of the semiconductor package.

The adhesive film for semiconductor is filled in the unevenness of the interconnect substrate surface through bonding the semiconductor chip and the interconnect substrate with the adhesive film for semiconductor, executing wire bonding between the semiconductor chip and the interconnect substrate, and utilizing the heat and pressure applied in a process of sealing with an encapsulating material, and hence the flow performance of the adhesive film for semiconductor in the encapsulating process plays the key role.

Besides, the semiconductor chips are currently stacked in a larger number of layers and hence a longer time is required for executing the wire bonding, which results in extended thermal history that the adhesive film for semiconductor is to undergo before being sealed with the encapsulating material. The adhesive film for semiconductor is, therefore, cured and loses fluidity before being sealed with the encapsulating material, which leads to the defect that the unevenness of the interconnect substrate surface cannot be properly filled.

DISCLOSURE OF THE INVENTION

Problem to be Solved by the Invention

An object of the present invention is to provide an adhesive film for semiconductor that exhibits superior filling performance in surface unevenness of a substrate through a process of sealing with an encapsulating material, despite that the adhesive film for semiconductor has to undergo an extended thermal history before being sealed with the encapsulating material, in a semiconductor device including semiconductor chips stacked in multiple layers, which requires a longer time for wire bonding, and a semiconductor device that employs such adhesive film.

Means for Solving the Problem

[1] An adhesive film for a semiconductor to be used for stacking semiconductor chips in two or more layers, comprising: (A) an ester (meth)acrylate copolymer, and (B) a thermoplastic resin other than the ester (meth)acrylate copolymer; the adhesive film for a semiconductor being composed so as to satisfy the following formula (1) for two hours from 10 minutes after starting measurement, in which γ represents an amount of shearing strain produced upon undergoing a shearing stress of 3000 Pa at a frequency of 1 Hz and a temperature of 175° C., on parallel plates of 20 mm in diameter:

$$0.10 \leq \gamma \leq 0.30 \qquad (1)$$

[2] The adhesive film for a semiconductor according to [1] above, being substantially free from a thermosetting resin.

[3] The adhesive film for a semiconductor according to [1] or

[2] above, wherein (B) the thermoplastic resin other than the ester (meth)acrylate copolymer is a phenoxy resin.

[4] The adhesive film for a semiconductor according to any of [1] to [3] above, wherein (A) the ester (meth)acrylate copolymer contains a monomer unit having a carboxyl group.

[5] The adhesive film for a semiconductor according to any of [1] to [4] above, wherein an added amount of (B) the thermoplastic resin other than the ester (meth)acrylate copolymer is equal to or more than 0.5 parts by weight and equal to or less than 30 parts by weight, with respect to 100 parts by weight of (A) the ester (meth)acrylate copolymer.

[6] The adhesive film for a semiconductor according to any of [1] to [5] above, further comprising (C) an inorganic filler.

[7] The adhesive film for a semiconductor according to [6] above, wherein (C) the inorganic filler is silica.

[8] The adhesive film for a semiconductor according to [6] or [7] above, wherein an added amount of (C) the inorganic filler is equal to or more than 5 parts by weight and equal to or less than 100 parts by weight, with respect to 100 parts by weight of resin composition other than (C) the inorganic filler.

[9] The adhesive film for a semiconductor according to any of [1] to [8] above, further comprising (D) a coupling agent.

[10] The adhesive film for a semiconductor according to [9] above, wherein an added amount of (D) the coupling agent is equal to or more than 0.01 parts by weight and equal to or less than 10 parts by weight, with respect to 100 parts by weight of resin composition.

[11] The adhesive film for a semiconductor according to any of [1] to [10] above, being configured so as to serve as a dicing sheet.

[12] A semiconductor device comprising semiconductor chips stacked in two or more layers with the adhesive film for a semiconductor according to any of [1] to [11] above.

Advantage of the Invention

The present invention provides an adhesive film for semiconductor that exhibits superior filling performance in surface unevenness of a substrate through a process of sealing with an encapsulating material, despite that the adhesive film for semiconductor has to undergo an extended thermal history before being sealed with the encapsulating material, in a semiconductor device including semiconductor chips stacked in multiple layers, which requires a longer time for wire bonding, and a semiconductor device that employs such adhesive film.

BEST MODE FOR CARRYING OUT THE INVENTION

Figure 1:
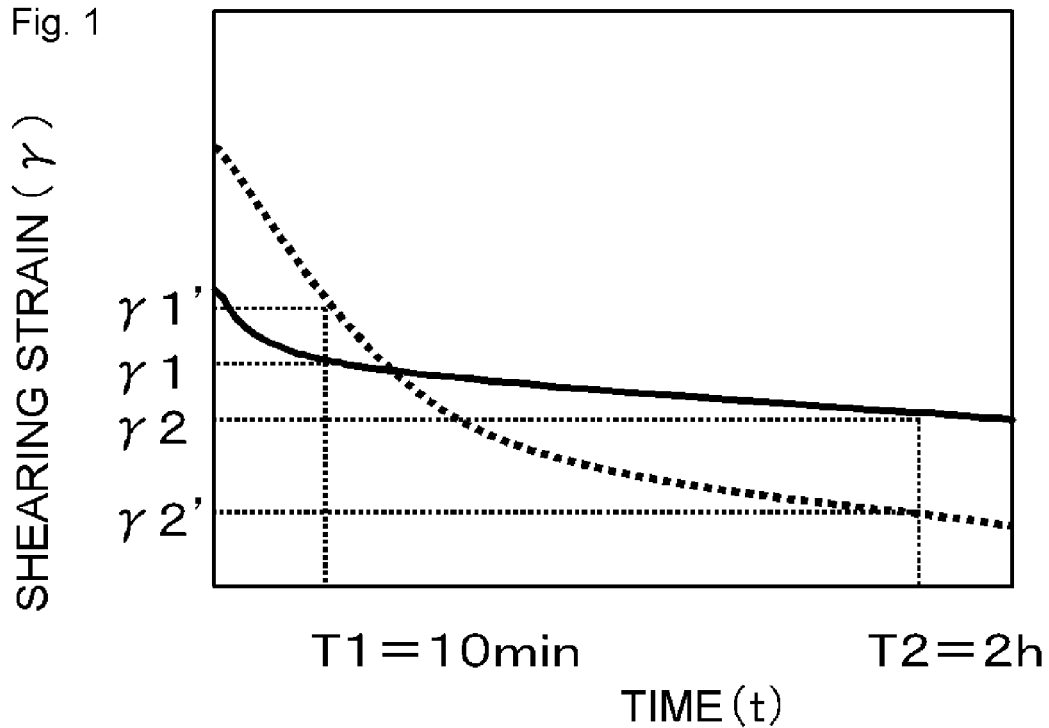
FIG. 1 is a graph schematically showing a relationship between time and a amount of shearing strain of an adhesive film for semiconductor according to the present invention.

Hereunder, an adhesive film for semiconductor according to the present invention will be described.

The adhesive film for semiconductor according to the present invention is composed so as to satisfy the following formula (1) for two hours from 10 minutes after starting measurement, in which $\gamma$ represents an amount of shearing strain produced upon undergoing a shearing stress of 3000 Pa at a frequency of 1 Hz and a temperature of 175° C., on parallel plates of 20 mm in diameter:

$$0.10 \leq \gamma \leq 0.30 \quad (1)$$

Semiconductor devices including semiconductor chips stacked in two or more layers with a conventional thermosetting type adhesive film for semiconductor have a problem in reliability, for example in that a crack is prone to appear on an adhesion interface. This is because a void is produced in the vicinity of the interface between the semiconductor chip and an interconnect substrate, and such problem is more prominently observed in the semiconductor device including semiconductor chips stacked in two or more layers. In the case of the semiconductor device including semiconductor chips stacked in two or more layers, twice or more of wire bonding processes have to be executed for electrically connecting the semiconductor chip and the interconnect substrate, and naturally a longer time is required when compared with the case where only a single layer of semiconductor chip is provided.

The wire bonding process is generally executed at a temperature of 150° C. to 175° C., and because of such thermal history the curing reaction of the thermosetting type adhesive film for semiconductor is progressed. Accordingly, since the semiconductor device including the semiconductor chips stacked in two or more layers undergoes a longer thermal history through the wire bonding process when compared with a semiconductor device including a single-layer semiconductor chip as stated above, the curing reaction of the thermosetting type adhesive film for semiconductor is progressed during the wire bonding process, and the fluidity of the adhesive film is thereby degraded through a process of sealing with an encapsulating material. It maybe construed that, consequently, the surface unevenness of the interconnect substrate cannot be properly filled through the encapsulating process and thus the void is produced, which results in degraded reliability of the semiconductor device.

The present inventor has assumed that a reason that the surface unevenness of the interconnect substrate cannot be properly filled through the encapsulating process is the progress of the curing reaction of the adhesive film for semiconductor due to the thermal history through the wire bonding process, which decreases the amount of shearing strain $\gamma$ with respect to the load imposed through the encapsulating process, and has investigated the amount of shearing strain $\gamma$ of the conventional thermosetting type adhesive film for semiconductor after two hours of heat treatment at 175° C., thereby obtaining a result of $\gamma$=approx. 0.06.

The present invention has discovered that the surface unevenness of the interconnect substrate can be more properly filled with the adhesive film for semiconductor through the encapsulating process, to thereby improve the reliability of the semiconductor device, by adjusting the amount of shearing strain $\gamma$ of the adhesive film for semiconductor so as to be equal to or more than 0.10 and equal to or less than 0.30 which is significantly higher than the conventional value, through a period of 10 minutes to two hours at 175° C., which is a normal thermal history that a semiconductor device including semiconductor chips stacked in two or more layers is to undergo through the encapsulating process.

The amount of shearing strain $\gamma$ referred to in the present invention may be measured, for example with a rheometer which is a viscoelasticity measuring apparatus, by applying a shearing stress 3000 Pa at a frequency of 1 Hz to a sample of the adhesive film for semiconductor cut in a size of 25 mm×25 mm and stacked in a thickness of 100 μm, at a constant temperature of 175° C. on a parallel plate of 20 mm in diameter.

FIG. 1 is a graph schematically showing a relationship between time (t) after starting the measurement and a amount of shearing strain ($\gamma$) of the adhesive film for semiconductor according to the present invention, measured upon applying the shearing force at the constant temperature of 175° C. From FIG. 1 it is understood that the conventional thermosetting type adhesive film for semiconductor exhibits larger fluctuation in amount of shearing strain due to the thermal history, as indicated by broken lines, in the period of T1 to T2 from 10 minutes after starting the measurement ($\gamma1'$) to two hours thereafter ($\gamma2'$). In contrast, it is apparent that the adhesive film for semiconductor according to the present invention has such characteristic as presenting smaller fluctuation in amount of shearing strain due to thermal history as indicated by solid lines, in the period of T1 to T2 from 10 minutes after starting the measurement ($\gamma1'$) to two hours thereafter ($\gamma2'$).

Although the amount of shearing strain of the adhesive film for semiconductor according to the present invention from 10 minutes after starting the measurement until two hours thereafter is specified as equal to or more than 0.10 and equal to or less than 0.30, a more preferable range is 0.12 to 0.25, and a range of 0.15 to 0.20 is still more preferable. Adjusting the shearing strain in the foregoing ranges assures desirable fluidity of the adhesive film for semiconductor through the encapsulating process, and suppresses a positional shift of the semiconductor chip that may be provoked by the sealing pressure.

According to the present invention, the resin composition of the adhesive film for semiconductor contains an (A) ester (meth)acrylate copolymer and a (B) thermoplastic resin other than the ester (meth)acrylate copolymer, so that the amount of shearing strain γ can be set in a predetermined range.

More specifically, properly adjusting the amount of (A) the ester (meth)acrylate copolymer, and selecting the type and mixing ratio of (B) the thermoplastic resin other than the ester (meth)acrylate copolymer, which has a higher thermal time elastic modulus and fluidity than (A) ester (meth)acrylate copolymer, enables setting the amount of shearing strain γ in the predetermined range.

First, the resin composition of the adhesive film for semiconductor will be described. Each of the components may be a single compound, or a combination of a plurality of compounds.

It is preferable that (A) the ester (meth)acrylate copolymer according to the present invention is a copolymer composed of an ester (meth)acrylate monomer and another monomer, and it is more preferable that (A) the ester (meth)acrylate copolymer contains a compound having an epoxy group, a hydroxyl group, a carboxyl group, a nitrile group or the like. Such composition improves the adhesion performance to an object to be bonded such as a semiconductor chip.

Examples of the ester (meth)acrylate monomer include ester acrylate such as acrylate methyl or acrylate ethyl, ester methacrylate such as methacrylate methyl or methacrylate ethyl, glycidyl methacrylate having a glycidylether group, hydroxy methacrylate or 2-hydroxyethylmethacrylate having a hydroxyl group, acrylate or methacrylate having a carboxyl group, N,N-dimethyl acrylamide having an amide group, and acrylonitrile having a nitrile group.

Above all, it is preferable to employ an ester (meth)acrylate copolymer containing a monomer unit having a carboxyl group. Such composition improves the adhesion performance with silicon constituting the interface of the semiconductor chip, thereby upgrading the reliability of the semiconductor package.

The content of the compound having a carboxyl group may be equal to or more than 0.5 mol %, and more preferably equal to or more than 1 mol % of the entirety of (A) the ester (meth)acrylate copolymer, from the viewpoint of obtaining a cured product of a high glass transition temperature. On the other hand, the content of the compound having a carboxyl group may be equal to or less than 10 mol %, and more preferably equal to or less than 5 mol % of the entirety of (A) the ester (meth)acrylate copolymer, from the viewpoint of improving the conservability of the adhesive film.

Mixing (A) the ester (meth)acrylate copolymer in the resin composition contributes to improving the initial adhesion, because of the low glass transition temperature.

Here, the "initial adhesion" designates the adhesion performance through an initial stage upon bonding the semiconductor chip and a supporting base material with the adhesive film for semiconductor, in other words the adhesion performance before the adhesive film for semiconductor is cured.

It is preferable that the weight-average molecular weight of (A) the ester (meth)acrylate copolymer is, for example, a hundred thousand or more, and more preferably two hundred thousand or more, from the viewpoint of the film-forming performance of the adhesive film. On the other hand, it is preferable that the weight-average molecular weight of (A) the ester (meth)acrylate copolymer is, for example, two million or less, and more preferably one million or less, from the viewpoint of securing proper viscosity of the resin solution for making the adhesive film and sufficient fluidity of the adhesive film for semiconductor through the encapsulating process.

It is preferable that the glass transition temperature of (A) the ester (meth)acrylate copolymer is, for example, equal to or higher than 0° C., and more preferably equal to or higher than 5° C., from the viewpoint of preventing excessive adhesion of the adhesive film to thereby improve the work efficiency. On the other hand, it is preferable that the glass transition temperature of (A) the ester (meth)acrylate copolymer is, for example, equal to or lower than 30° C., and more preferably equal to or lower than 20° C., from the viewpoint of improving the adhesion under a low temperature.

(B) The thermoplastic resin other than the ester (meth) acrylate copolymer according to the present invention serves to increase the thermal time elastic modulus of the adhesive film for semiconductor immediately after the heat-press bonding of the semiconductor chip to thereby facilitate the semiconductor chip fixed by means of the adhesive film for semiconductor to withstand the sealing pressure through the encapsulating process, and to secure sufficient fluidity of the adhesive film for semiconductor through the encapsulating process.

Specific examples of (B) the thermoplastic resin other than the ester (meth)acrylate copolymer include a phenoxy resin, a nitrilebutadiene rubber, a butyral resin, a polyamide resin, and a polyimide resin, out of which one or a combination of two or more may be employed.

Above all, the phenoxy resin may be suitably employed because of, in addition to the foregoing advantages, high miscibility with the ester acrylate copolymer, which enables forming a film having a neat appearance and improving the adhesion performance with an organic substrate.

In the resin composition of the adhesive film for semiconductor according to the present invention, it is preferable that the mixing ratio of (B) the thermoplastic resin other than the ester (meth)acrylate copolymer is equal to or more than 0.5 parts by weight and equal to or less than 30 parts by weight, and more preferably equal to or more than 3 parts by weight and equal to or less than 20 parts by weight, with respect to 100 parts by weight of (A) the ester (meth)acrylate copolymer. Such composition enables securing both the neat appearance of the adhesive film for semiconductor and sufficient fluidity thereof through the encapsulating process.

It is preferable that the adhesive film for semiconductor according to the present invention is composed of a resin substantially free from a thermosetting resin. The resin composition substantially free from a thermosetting resin specifically refers to such resin composition containing a thermosetting resin in a ratio not exceeding 3 wt. % with respect to the entirety of the resin composition. The adhesive film for semiconductor may contain an epoxy resin in order to improve the adhesion performance with the interconnect substrate and to enhance the heat resistance of the adhesive film for semiconductor to thereby upgrade the reliability of the semiconductor device, provided that the content does not exceed 3 wt. %, and preferably the content is 2 wt. % or less, and more preferable 1 wt. % or less. Such content of the thermosetting resin suppresses degradation in fluidity of the adhesive film for semiconductor through the encapsulating process, because the curing reaction of the thermosetting resin due to the thermal history through the wire bonding process barely affects the performance of the adhesive film.

Examples of the thermosetting resin include a novolac type phenol resin such as a phenol novolac resin, a cresol novolac resin, or a bisphenol A novolac resin, a resole phenol resin such as an unmodified resole phenol resin or a resole phenol resin modified with tung oil, a bisphenol epoxy resin such as a bisphenol A epoxy resin or a bisphenol F epoxy resin, a novolac type epoxy resin such as a phenol novolac type epoxy resin or a cresol novolac type epoxy resin, an epoxy resin such as a biphenyl epoxy resin, a hydroquinone epoxy resin, a stilbene epoxy resin, a triphenol methane epoxy resin, a triazine nucleus-containing epoxy resin, a dicyclopentadiene-modified phenol epoxy resin, a naphthol type epoxy resin, a phenol aralkyl epoxy resin, or a naphtholaralkyl epoxy resin, a resin having a triazine ring such as a urea resin or a melamine resin, a polyurethane resin, a silicone resin, a resin having a benzoxazine ring, a cyanate ester resin, a (meth) acryloylated phenol novolac resin having a phenol hydroxyl group, acrylate such as a vinylester resin or an urethane acrylate resin, an unsaturated polyester resin, a diallylphthalate resin, and a maleimide resin, out of which the epoxy resin such as the novolac type epoxy resin, the bisphenol epoxy resin, or the biphenyl epoxy resin may be suitably employed.

For example, employing the novolac type epoxy resin enables raising the glass transition temperature of the adhesive film for semiconductor, and lowering the elastic modulus thereof. Employing the naphthol type epoxy resin enables raising the glass transition temperature of the adhesive film for semiconductor, and enhancing the adhesion at the bonding interface.

The resin composing the adhesive film for semiconductor according to the present invention may contain (C) the inorganic filler. The inorganic filler serves to increase the thermal time elastic modulus of the adhesive film for semiconductor immediately after the heat-press bonding process of the semiconductor chip and the interconnect substrate, to facilitate the semiconductor chip to withstand the sealing pressure of the encapsulating material through the encapsulating process, and to maintain proper fluidity of the adhesive film for semiconductor through the encapsulating process. Examples of (C) the inorganic filler include silver, titanium oxide, silica, myca, and aluminum oxide. Above all, the silica filler is preferable. Employing the silica filler, which exhibits high dispersion performance in the adhesive film, enables providing a neat appearance to the adhesive film, reducing the linear expansion coefficient of the adhesive film for semiconductor, suppressing the distortion of the semiconductor chip in the case of stacking the semiconductor chips in two or more layers, and improving the work efficiency through the manufacturing process of the adhesive film.

The silica filler is available in a fragmented form and fused form, out of which the latter is preferable from the viewpoint of uniform dispersibility in the adhesive film for semiconductor.

The average particle diameter of (C) the inorganic filler may preferably be set to be equal to or more than 0.01 μm, and more preferably equal to or more than 0.1 μm, from the viewpoint of suppressing the aggregation of the filler in the adhesive film for semiconductor and improving the appearance thereof. On the other hand, it is preferable to set the average particle diameter of (C) the inorganic filler to be equal to or less than 20 μm, and more preferably equal to or less than 5 μm, from the viewpoint of assuring that the inorganic filler is inhibited from sticking out of the adhesive film and from thereby destroying the semiconductor chip in the heat-press bonding process.

Although the content of (C) the inorganic filler is not specifically limited, it is preferable that the content is equal to or more than 5 parts by weight, and more preferably equal to or more than 10 parts by weight, with respect to 100 parts by weight of the resin composition excluding the inorganic filler. Such content contributes to increasing the thermal time elastic modulus of the adhesive film immediately after the heat-press bonding process of the semiconductor chip and the interconnect substrate, and facilitates the semiconductor chip to withstand the sealing pressure of the encapsulating material through the encapsulating process. Also, it is preferable that the content of (C) the inorganic filler is equal to or less than 100 parts by weight, and more preferably equal to or less than 80 parts by weight, with respect to 100 parts by weight of the resin composition. Setting the content of (C) the inorganic filler in the foregoing range enables maintaining the proper fluidity of the adhesive film through the encapsulating process.

The resin composing the adhesive film for semiconductor according to the present invention may contain (D) the coupling agent. The coupling agent serves to further improve the adhesion performance between the resin in the adhesive film for semiconductor and the surface of the object to be bonded, as well as between the resin in the adhesive film for semiconductor and the silica surface.

Examples of (D) the coupling agent include a silane-based, a titanium-based, and an aluminum-based agent, among which the silane-based coupling agent is preferable from the viewpoint of the adhesion performance with silicon, which constitutes the interface of the semiconductor chip.

Examples of the suitable silane coupling agent include vinyltrichlorosilane, vinyltrimethoxysilane, vinyltriethoxysilane, β-(3,4 epoxycyclohexyl)ethyltrimethoxysilane, γ-glycidoxypropyltrimethoxysilane, γ-glycidoxypropylmethyldimethoxysilane, γ-methacryloxypropyltrimethoxysilane, γ-methacryloxypropylmethyldiethoxysilane, γ-methacryloxypropyltriethoxysilane, N-β(aminoethyl)γ-aminopropylmethyldimethoxysilane, N-β(aminoethyl)γ-aminopropyltrimethoxysilane, N-β(aminoethyl)γ-aminopropyltriethoxysilane, γ-aminopropyltrimethoxysilane, γ-aminopropyltriethoxysilane, N-phenyl-γ-aminopropyltrimethoxysilane, γ-chloropropyltrimethoxysilane, γ-mercaptopropyltrimethoxysilane, 3-isocyanatepropyltriethoxysilane, and 3-acryloxypropyltrimethoxysilane, out of which one or a combination of two or more may be employed.

It is preferable that the content of (D) the coupling agent is equal to or more than 0.01 parts by weight, and more preferably equal to or more than 0.1 parts by weight, with respect to 100 parts by weight of the resin composition, from the viewpoint of further improving the adhesion performance. On the other hand, it is preferable that the content of (D) the coupling agent is equal to or less than 10 parts by weight, and more preferably equal to or less than 5 parts by weight with respect to 100 parts by weight of the resin composition, from the viewpoint of suppressing the emergence of decomposition gas (out gas) and a void.

Also, the resin composing the adhesive film for semiconductor according to the present invention may contain (E) the phenol resin being a low-molecular-weight monomer, for the purpose of providing tacking capability and improving temporary adhesion performance.

Examples of (E) the phenol resin include a phenol novolac resin, a cresol novolac resin, a phenolaralkyl resin (containing a phenylene or biphenylene skeleton), a naphtholaralkyl resin, a triphenolmethane resin, and a dicyclopentadiene phenol resin. One or a combination of two or more of them may be employed.

Further, the resin composing the adhesive film for semiconductor according to the present invention may contain a component other than (A) the to (E) as the case may be, for adjusting the work efficiency and properties.

The adhesive film for semiconductor according to the present invention may be obtained, for example, through dissolving the foregoing resin composition in a solvent such as methylethylketone, acetone, toluene, or dimethylformaldehyde to thereby form a varnish, and applying the varnish to a release sheet with a comma coater, a die coater, or a gravure coater, and removing the release sheet after drying.

Although the thickness of the adhesive film for semiconductor is not specifically limited, it is preferable that the thickness is equal to or more than 3 μm and equal to or less than 100 μm, and more preferably equal to or more than 5 μm and equal to or less than 70 μm. The thickness of such range is easy to adjust with accuracy.

An example of the manner in which the adhesive film serves as a dicing sheet is as follows.

A protective film is adhered to the face of the adhesive film with the release sheet, obtained through applying the adhesive film to the release sheet and drying, opposite to the face with the release sheet, and the release sheet and the adhesive film layer are cut in half. Then a dicing sheet constituted of an adhesive layer and a base film is adhered to the release sheet, such that the adhesive layer of the dicing sheet and the face of the release sheet opposite to the adhesive film layer oppose each other, and the protective film is removed, by which the adhesive film having the dicing sheet function, constituted of the base film, the adhesive layer, the release sheet and the adhesive film layer layered in this order, can be obtained.

Now, a semiconductor device that includes the adhesive film for semiconductor according to the present invention will be described hereunder.

In the semiconductor device according to the present invention, the semiconductor chip and the lead frame, the semiconductor chip and the interconnect substrate, and the semiconductor chip and another semiconductor chip are bonded with the adhesive film for semiconductor according to the present invention. An embodiment of the present invention may be defined as, for example, a semiconductor device including a semiconductor electronic component that includes a first semiconductor chip and an interconnect substrate, which are disposed such that the face of the first semiconductor chip opposite to the face opposes the face with the electrode of the interconnect substrate, wherein the first semiconductor chip and the interconnect substrate are bonded with the adhesive film for semiconductor according to the present invention. Another embodiment may be defined as the semiconductor device defined as above, but including a multilayer type semiconductor electronic component that further includes a second semiconductor chip stacked on the face with the electrode of the first semiconductor chip, wherein the first semiconductor chip and the second semiconductor chip are bonded with the adhesive film for semiconductor according to the present invention. In the multilayer type semiconductor electronic component, the adhesive film for semiconductor according to the present invention may be employed solely for bonding the first semiconductor chip and the interconnect substrate. The structure of the semiconductor device according to the present invention is not specifically limited, provided that the semiconductor chip and the lead frame, the semiconductor chip and the interconnect substrate, and the semiconductor chip and another semiconductor chip are bonded with the adhesive film for semiconductor according to the present invention.

Figure 2:
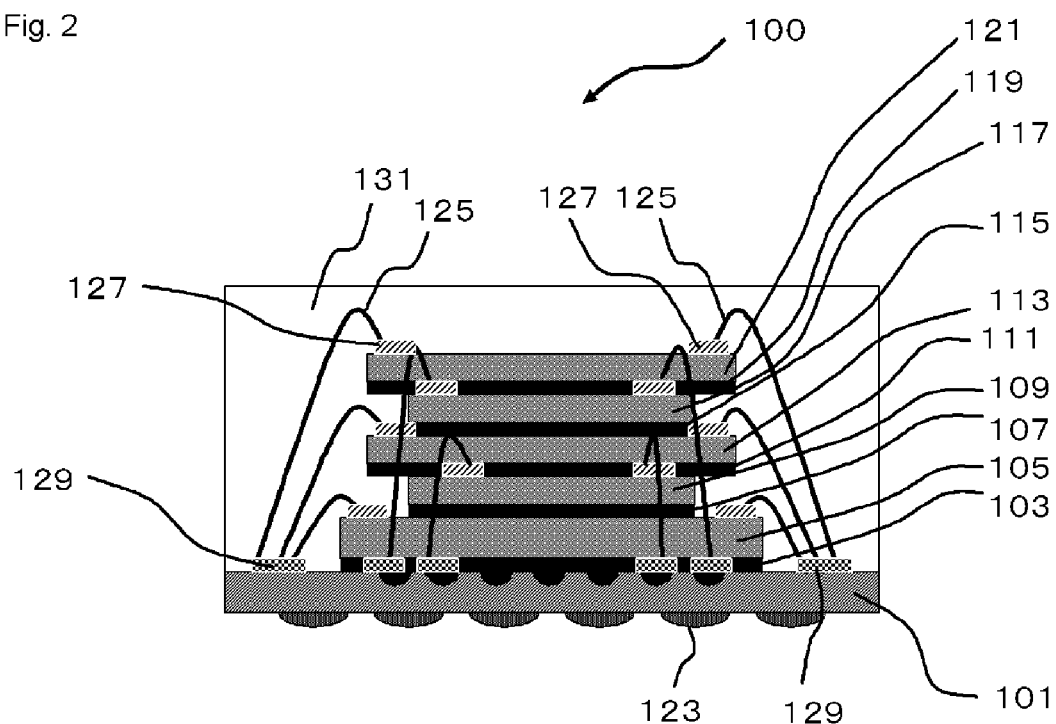
FIG. 2 is a cross-sectional view showing a structure of a semiconductor device according to an embodiment.

FIG. 2 is a cross-sectional view showing a structure of the semiconductor device including the adhesive film for semiconductor according to an embodiment of the present invention. For the description of the drawings, same constituents are given the same numeral, and the description thereof will not be repeated.

The semiconductor device 100 shown in FIG. 2 includes a first semiconductor chip 105, a second semiconductor chip 109, a third semiconductor chip 113, a fourth semiconductor chip 117 and a fifth semiconductor chip 121 stacked in this order on an interconnect substrate 101, and the respective semiconductor chips are conductively connected to a wire bonding electrode 127 on the semiconductor chip and wire bonding electrode 129 on the interconnect substrate, through a wire 125. Also, the semiconductor chips and the wire 125 are enclosed in an encapsulating material 131, to be thereby protected. On the back face of the interconnect substrate 101, a plurality of external connection electrodes 123 is provided so as to serve as an external connection terminal.

In the semiconductor device 100 shown in FIG. 2, the first semiconductor chip 105 and the interconnect substrate 101 are bonded with a first adhesive film for semiconductor 103, such that the face of the former opposite to the face with the electrode and the face with the electrode of the latter oppose each other; the first semiconductor chip 105 and the second semiconductor chip 109 are bonded with a second adhesive film for semiconductor 107 such that the upper face of the former (face with the electrode) and the lower face of the latter (opposite to the face with the electrode) oppose each other; the second semiconductor chip 109 and the third semiconductor chip 113 are bonded with a third adhesive film for semiconductor 111 such that the upper face of the former (face with the electrode) and the lower face of the latter (opposite to the face with the electrode) oppose each other; the third semiconductor chip 113 and the fourth semiconductor chip 117 are bonded with a fourth adhesive film for semiconductor 115 such that the upper face of the former (face with the electrode) and the lower face of the latter (opposite to the face with the electrode) oppose each other; and the fourth semiconductor chip 117 and the fifth semiconductor chip 121 are bonded with a fifth adhesive film for semiconductor 119 such that the upper face of the former (face with the electrode) and the lower face of the latter (opposite to the face with the electrode) oppose each other.

Also, the first semiconductor chip 105, the second semiconductor chip 109, the third semiconductor chip 113, the fourth semiconductor chip 117, and the fifth semiconductor chip 121 are each conductively connected to the wire bonding electrode 127 on the respective semiconductor chip and the wire bonding electrode 129 on the interconnect substrate 101, through the wire 125.

Further, although not specifically limited, it is preferable that the semiconductor chip located at an upper level is smaller than the one at a lower level, such that it is preferable that the second semiconductor chip 109 is smaller than the first semiconductor chip 105, and it is preferable, from the viewpoint of achieving a higher integration density of the semiconductor chips, that the semiconductor chip of the higher level is located at a generally central portion of the semiconductor chip of the lower level. Also, it is preferable that the wire bonding electrode 127 of the respective semiconductor chip, to which the wire 125 is to be connected, is located in a peripheral portion of the semiconductor chip.

In the case where the semiconductor chips are stacked in multiple layers as in the semiconductor device 100, and hence undergo the long thermal history through the wire bonding process, employing the adhesive film for semiconductor according to the present invention as the first adhesive film for semiconductor 103 enables preventing insufficient filling performance of the adhesive film for semiconductor in the surface unevenness of the interconnect substrate through the encapsulating process, to thereby suppress separation of the adhesive film for semiconductor and emergence of a crack in the package, through the reflow process of the semiconductor device 100.

Although this embodiment represents the semiconductor device 100 including five layers of semiconductor chips, the number of layers of the semiconductor chips is not limited, and the adhesive film for semiconductor according to the present invention and the conventional adhesive film for semiconductor may be employed in combination.

A method of manufacturing the semiconductor device will now be described.

Figure 3:
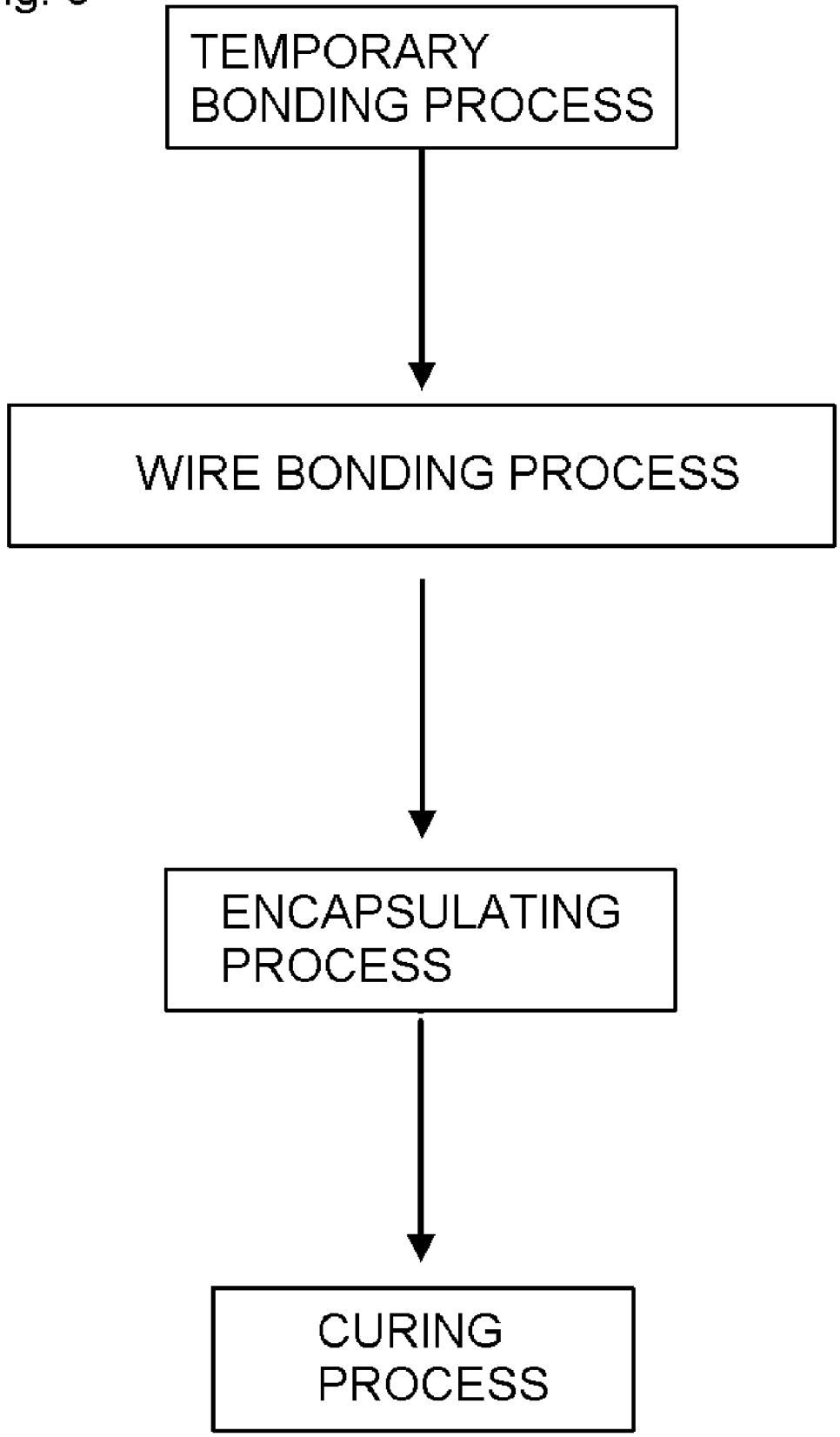
FIG. 3 is a flowchart of a manufacturing process of the semiconductor device according to the embodiment.

FIG. 3 is a flowchart of a manufacturing process of the semiconductor device.

As shown in FIG. 3, the semiconductor device is manufactured through a temporary bonding process including temporarily bonding the semiconductor chip and the interconnect substrate, or the semiconductor chip and another semiconductor chip, with the adhesive film for semiconductor, a wire bonding process including bonding a wire for electrically connecting the semiconductor chip and the interconnect substrate, an encapsulating process including encapsulating the semiconductor chip and the bonding wire with the encapsulating resin, and a curing process including curing the encapsulating resin and the adhesive film.

The foregoing process will be respectively described hereunder.

[Temporary Bonding Process]

In this process, actually the interconnect substrate, the adhesive film for semiconductor, and the semiconductor chip are stacked in this order, and the semiconductor chip and the interconnect substrate are temporarily bonded by heat-press bonding. Here, the adhesive film for semiconductor may be bonded to the semiconductor chip or the interconnect substrate in advance. The temporary bonding may be executed through heat-pressing at a temperature of 80° C. to 150° C. under a load of 1 N to 20 N for 0.1 to 5 seconds, for example with a die bonder (AD898, manufactured by ASM). In this process it is preferable to employ a low temperature, a low load, and a short duration in time in the heat-press bonding, in order to prevent the semiconductor chip from being destroyed, and in this process a void may be present between the interconnect substrate and the adhesive film for semiconductor, because it is still difficult to completely fill the surface unevenness of the interconnect substrate with the adhesive film for semiconductor.

[Wire Bonding Process]

In this process, the electrode of the semiconductor chip and that of the interconnect substrate are electrically connected by means of a bonding wire. The connection of the bonding wire may be executed, for example, with a wire bonder (EAGLE60, manufactured by ASM) at a temperature of 150° C. to 200° C.

In the semiconductor device including the semiconductor chips stacked in two or more layers, the wire bonding process of the first layer semiconductor chip is followed by the temporary bonding of the second layer, and the wire bonding of the second layer is executed, which is then followed by the temporary bonding of an upper layer on the semiconductor chip that has undergone the wire bonding, and thus the wire bonding is repeatedly executed.

[Encapsulating Process]

In this process, the semiconductor chip and the bonding wire connecting the electrode of the semiconductor chip and that of the interconnect substrate are covered with the encapsulating resin so as to be encapsulated. Thus process assures the insulation and moisture exclusion. The encapsulating may be executed, for example, with a transfer molding machine at a high temperature of 150° C. to 200° C. and under a high pressure of 50 to 100 kg/mm$^2$. Also, the adhesive film for semiconductor is softened upon applying the encapsulating resin, so that the surface unevenness of the interconnect substrate is completely filled.

With the adhesive film for semiconductor, in the case where the semiconductor chips are stacked in multiple layers and hence undergo the longer thermal history through the wire bonding process, the adhesive film for semiconductor is cured and degrades in fluidity, which incurs such defect that the surface unevenness of the interconnect substrate cannot be sufficiently filled. Employing the adhesive film according to the present invention enables preventing such defect.

[Curing Process]

In this process, the encapsulating resin is finally cured, and so is the adhesive film for semiconductor. Thus, the semiconductor device as a final product can be obtained.

Although the curing condition is not specifically limited provided that the encapsulating resin and the adhesive film for semiconductor can be cured as desired, it is preferable to set, for example, the temperature at 100° C. to 200° C. and the duration in time as 5 to 300 minutes, and more preferably 120° C. to 180° C. for 30 to 240 minutes.

Throughout the foregoing process, finally the semiconductor device 100 as shown in FIG. 2 can be obtained.

The structure of the semiconductor device is not limited to those exemplified above, and the semiconductor device may have any other structure provided that the semiconductor chip is bonded with an object to be bonded with the adhesive film for semiconductor.

Although the embodiment of the present invention has been described referring to the drawings, it is to be understood that the embodiment is merely exemplary and that various other configurations may be adopted.

Hereunder, the present invention will be described in further details based on Examples and Comparative examples, however the present invention is in no way limited to such examples. It is to be noted that Table 1 shows the mixture ratio of the components and the evaluation result of the adhesive film according to the following Examples and the Comparative examples.

EXAMPLES

Example 1

Preparation of Resin Varnish for Adhesive Film 100 parts by weight of ester acrylate copolymer (ethylacrylate-butylacrylate-acrylonitrile-acrylate-hydroxyethyl methacrylate copolymer, SG-708-6DR manufactured by Nagase Chemtex Corporation, Tg: 6° C., weight-average molecular weight: 500,000) serving as the ester (meth)acrylate copolymer, 10 parts by weight of phenoxy resin (JER1256, manufactured by Japan Epoxy Resins Co., Ltd., Mw: 50000) serving as the thermoplastic resin other than the ester (meth)acrylate copolymer, 78 parts by weight of spherical silica (SE2050 manufactured by Admatechs Co., Ltd., average particle diameter 0.5 μm) serving as the inorganic filler, 2 parts by weight of γ-glycidoxypropyl trimethoxysilane (KBM403E, manufactured by Shin-Etsu Chemical Co., Ltd.) serving as the coupling agent, and 10 parts by weight of (PR-HF-3 manufactured by Sumitomo Bakelite Co., Ltd., hydroxyl group equivalent 104 g/OH group) serving as the phenol resin, were dissolved in methylethylketone (MEK), and thereby a resin varnish with a resin solid content of 20% was obtained.

[Making Up an Adhesive Film]

The resin varnish thus obtained was applied with a comma coater to a polyethylene telephthalate film (Art. No. Purex A54 manufactured by Teijin DuPont Films Japan Ltd., thickness 38 μm) serving as the base film (I) and dried at 150° C. for 3 minutes, to thereby obtain an adhesive film of 25 μm in thickness.

[Making Up a Dicing Sheet]

Kuriatekku CT-H717 (manufactured by Kuraray Co., Ltd.) composed of 60 parts by weight of Hybrar and 40 parts by weight of polypropylene was formed into a film of 100 μm in thickness serving as a base film (II), with an extruder, and the surface was corona-treated. Then a copolymer obtained through copolymerizing 50 parts by weight of acrylate 2-ethylhexyl, 10 parts by weight of butylacrylate, 37 parts by weight of vinyl acetate, and 3 parts by weight of methacrylate 2-hydroxyethyl, having a weight-average molecular weight of 500000, was applied to a peeled polyester film of 38 μm in thickness, such that the thickness of the copolymer becomes 10 μm after drying, and dried at 80° C. for 5 minutes to thereby obtain an adhesive layer. Then the adhesive layer was laminated over the corona-treated surface of the base film (II), so that a dicing sheet composed of the base film (II), the adhesive layer, and the polyester film layered in this order was obtained.

[Making Up an Adhesive Film with Dicing Sheet Function]

A protective film was adhered to the adhesive film layer of the base film (I) coated with the adhesive film, and the base film (I) and the adhesive film layer were cut in half in a diameter of 220 mm. Then the polyester film was removed from the dicing sheet constituted of the base film (II), the adhesive layer and the polyester film, and the adhesive layer and the base film (I) were adhered and the protective film was removed. As a result, the adhesive film with the dicing sheet function, composed of the base film (II), the adhesive layer, the base film (I) and the adhesive film layer layered in this order, was obtained.

[Measurement Method of Amount of Shearing Strain γ at 175° C.]

The adhesive films for semiconductor made up according to the Examples and the Comparative examples were cut in a size of 25 mm×25 mm, and stacked in several layers up to a thickness of 100 μm, to thereby make up the samples. The samples thus made up were subjected to a shearing stress of 3000 Pa at a frequency of 1 Hz and at a constant temperature of 175° C. on a parallel plate of 20 mm in diameter, with a viscoelastometer (HAAKE Rheostress RS-150 manufactured by Thermo Fisher Scientific, Inc.), and the amount of shearing strain γ was measured at 10 minutes and two hours after starting the measurement.

[Measurement Method of Die Shear Strength after Bonding]

The adhesive films for semiconductor made up according to the Examples and the Comparative examples were interleaved between a silicon chip of 4×4 mm in size and 550 μm in thickness and a bismaleimide-triazine substrate coated with a solder resist (Art. No. AUS308 manufactured by Taiyo Ink Mfg. Co., Ltd.), and heat-press bonded at 130° C., 5N, for 1 second, and such samples were subjected to two hours of heat treatment at 175° C. and then retained on a hot plate of 260° C. for 20 seconds, after which the shear strength was measured with a push-pull gauge at a speed of 0.5 mm/min., and such value was taken up as the die shear strength.

[Making Up a Semiconductor Device]

Figure 4:
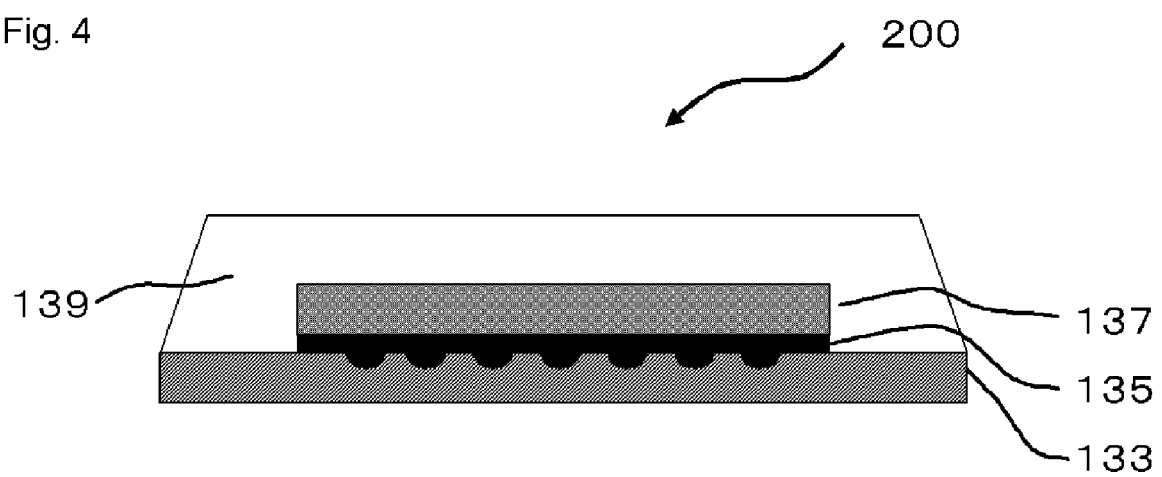
FIG. 4 is a cross-sectional view showing a structure of a semiconductor device according to another embodiment.

The following process was carried out, to make up a semiconductor device 200 shown in FIG. 4.

The adhesive film layer of an adhesive film 135 with the dicing sheet was set to oppose a back face of a wafer of 8-inch, 200 μm and adhered thereto at a temperature of 60° C., thus to obtain a wafer to which the adhesive film 135 with the dicing sheet is adhered.

Then the wafer to which the adhesive film 135 with the dicing sheet is adhered was diced into squares of 10 mm×10 mm, which was the size of a semiconductor chip 137, with a dicing saw at a spindle revolution speed of 30,000 rpm and a cutting speed of 50 mm/sec. Then the semiconductor chips were pushed up from the back of a die attach film with the dicing function, and separated along the interface between the base film (I) and the adhesive layer, to thereby obtain the semiconductor chip with the adhesive layer (adhesive film 135) 137.

The semiconductor chip with the adhesive layer 137 (square of 10 mm×10 mm) was heat-press bonded to a bismaleimide-triazine resin interconnect substrate 133 (interconnect level gap 5 to 10 μm) coated with the solder resist (Art. No. AUS308 manufactured by Taiyo Ink Mfg. Co., Ltd.) at 130° C., 5N, for 1 second, to thereby temporarily bond the semiconductor chip and the bismaleimide-triazine interconnect substrate. This was followed by heat treatment at 175° C. for 10 minutes or two hours, as simulation of the thermal history through the wire bonding process for stacking the semiconductor chips in multiple layers. Further a low-pressure transfer molding machine was employed for sealing with an encapsulating resin 139 (EME-G770 manufactured by Sumitomo Bakelite Co., Ltd.) at a molding temperature of 175° C., under a pressure of 70 kg/cm², for a curing time of two minutes, followed by two hours of heat treatment at 175° C., to thereby completely cure the encapsulating resin 139 thus to obtain 10 pieces of semiconductor devices.

[Filling Performance of Interconnect Substrate Level Gap]

As the filling performance with respect to the level gap on the interconnect substrate of the semiconductor devices, made up with the adhesive film obtained according to the Examples and the Comparative examples, was evaluated according to the following criteria with respect to the filling ratio of the level gap on the interconnect substrate with the adhesive film for semiconductor, with a scanning ultrasonic flaw detector (SAT).

aa: filling ratio was 100% bb: filling ratio was 80% or higher and less than 100% cc: filling ratio was 40% or higher and less than 80% dd: filling ratio was less than 40%, or voids were formed throughout the adhesive film.

[Crack Resistance]

The crack resistance was evaluated with the scanning ultrasonic flaw detector (SAT) according to the following criteria, through three times of IR reflow process at 260° C. after moisture absorption of the semiconductor devices made up with the adhesive film obtained according to the Examples and the Comparative examples, at 85° C. and RH 60% for 168 hours.

aa: the number of cracks was 0 among the 10 pieces
bb: the number of cracks was 1 to 3 among the 10 pieces
cc: the number of cracks was 4 to 9 among the 10 pieces
dd: the number of cracks was 10 among the 10 pieces Example 2

Preparation of Resin Varnish for Adhesive Film 100 parts by weight of ester acrylate copolymer (ethylacrylate-butylacrylate-acrylonitrile-acrylate-hydroxyethyl methacrylate copolymer, SG-708-6DR manufactured by Nagase Chemtex Corporation, Tg: 6° C., weight-average molecular weight: 500,000) serving as the ester (meth)acrylate copolymer, 10 parts by weight of phenoxy resin (JER1256, manufactured by Japan Epoxy Resins Co., Ltd., Mw: 50000) serving as the thermoplastic resin other than the ester (meth)acrylate copolymer, 78 parts by weight of spherical silica (SE2050 manufactured by Admatechs Co., Ltd., average particle diameter 0.5 μm) serving as the inorganic filler, and 2 parts by weight of γ-glycidoxypropyl trimethoxysilane (KBM403E, manufactured by Shin-Etsu Chemical Co., Ltd.) serving as the coupling agent, were employed.

The evaluation was performed in the same way as with the Example 1, except for the difference in preparation of the resin varnish for the adhesive film.

Example 3

Preparation of Resin Varnish for Adhesive Film 100 parts by weight of ester acrylate copolymer (ethylacrylate-butylacrylate-acrylonitrile-acrylate-hydroxyethyl methacrylate copolymer, SG-708-6DR manufactured by Nagase Chemtex Corporation, Tg: 6° C., weight-average molecular weight: 500,000) serving as the ester (meth)acrylate copolymer, 30 parts by weight of phenoxy resin (JER1256, manufactured by Japan Epoxy Resins Co., Ltd., Mw: 50000) serving as the thermoplastic resin other than the ester (meth)acrylate copolymer, 78 parts by weight of spherical silica (SE2050 manufactured by Admatechs Co., Ltd., average particle diameter 0.5 μm) serving as the inorganic filler, and 2 parts by weight of γ-glycidoxypropyl trimethoxysilane (KBM403E, manufactured by Shin-Etsu Chemical Co., Ltd.) serving as the coupling agent, were employed.

The evaluation was performed in the same way as with the Example 1, except for the difference in preparation of the resin varnish for the adhesive film.

Example 4

Preparation of Resin Varnish for Adhesive Film 100 parts by weight of ester acrylate copolymer (ethylacrylate-butylacrylate-acrylonitrile-acrylate-hydroxyethyl methacrylate copolymer, SG-708-6DR manufactured by Nagase Chemtex Corporation, Tg: 6° C., weight-average molecular weight: 500,000) serving as the ester (meth)acrylate copolymer, 0.5 parts by weight of phenoxy resin (JER1256, manufactured by Japan Epoxy Resins Co., Ltd., Mw: 50000) serving as the thermoplastic resin other than the ester (meth)acrylate copolymer, 78 parts by weight of spherical silica (SE2050 manufactured by Admatechs Co., Ltd., average particle diameter 0.5 μm) serving as the inorganic filler, and 2 parts by weight of γ-glycidoxypropyl trimethoxysilane (KBM403E, manufactured by Shin-Etsu Chemical Co., Ltd.) serving as the coupling agent, were employed.

The evaluation was performed in the same way as with the Example 1, except for the difference in preparation of the resin varnish for the adhesive film.

Example 5

Preparation of Resin Varnish for Adhesive Film 100 parts by weight of ester acrylate copolymer (ethylacrylate-butylacrylate-acrylonitrile-acrylate-hydroxyethyl methacrylate copolymer, SG-708-6DR manufactured by Nagase Chemtex Corporation, Tg: 6° C., weight-average molecular weight: 500,000) serving as the ester (meth)acrylate copolymer, 10 parts by weight of phenoxy resin (JER1256, manufactured by Japan Epoxy Resins Co., Ltd., Mw: 50000) serving as the thermoplastic resin other than the ester (meth)acrylate copolymer, 78 parts by weight of spherical silica (SE2050 manufactured by Admatechs Co., Ltd., average particle diameter 0.5 μm) serving as the inorganic filler, 2 parts by weight of γ-glycidoxypropyl trimethoxysilane (KBM403E, manufactured by Shin-Etsu Chemical Co., Ltd.) serving as the coupling agent, 4 parts by weight of phenol resin (PR-HF-3 manufactured by Sumitomo Bakelite Co., Ltd., hydroxyl group equivalent 104 g/OH group), and 6 parts by weight of orthocresol novolac type epoxy resin (EOCN-1020-80 manufactured by Nippon Kayaku Co., Ltd., epoxy equivalent 200 g/eq) serving as the epoxy resin, were employed.

The evaluation was performed in the same way as with the Example 1, except for the difference in preparation of the resin varnish for the adhesive film.

Example 6

Preparation of Resin Varnish for Adhesive Film 100 parts by weight of ester acrylate copolymer (ethylacrylate-acrylonitrile-glycidylmethacrylate-N,N dimethylacrylamide copolymer, manufactured by Nagase Chemtex Corporation, SG-80HDR, Tg: 10° C., weight-average molecular weight: 350,000) serving as the ester (meth)acrylate copolymer, 10 parts by weight of phenoxy resin (JER1256, manufactured by Japan Epoxy Resins Co., Ltd., Mw: 50000) serving as the thermoplastic resin other than the ester (meth)acrylate copolymer, 78 parts by weight of spherical silica (SE2050 manufactured by Admatechs Co., Ltd., average particle diameter 0.5 μm) serving as the inorganic filler, and 2 parts by weight of γ-glycidoxypropyl trimethoxysilane (KBM403E, manufactured by Shin-Etsu Chemical Co., Ltd.) serving as the coupling agent, were employed.

The evaluation was performed in the same way as with the Example 1, except for the difference in preparation of the resin varnish for the adhesive film.

Example 7

Preparation of Resin Varnish for Adhesive Film 100 parts by weight of ester acrylate copolymer (ethylacrylate-butylacrylate-acrylonitrile-acrylate-hydroxyethyl methacrylate copolymer, SG-708-6DR manufactured by Nagase Chemtex Corporation, Tg: 6° C., weight-average molecular weight: 500,000) serving as the ester (meth)acrylate copolymer, 12 parts by weight of phenoxy resin (JER1256, manufactured by Japan Epoxy Resins Co., Ltd., Mw: 50000) serving as the thermoplastic resin other than the ester (meth)acrylate copolymer, and 78 parts by weight of spherical silica (SE2050 manufactured by Admatechs Co., Ltd., average particle diameter 0.5 μm) serving as the inorganic filler, were employed.

The evaluation was performed in the same way as with the Example 1, except for the difference in preparation of the resin varnish for the adhesive film.

Example 8

Preparation of Resin Varnish for Adhesive Film 100 parts by weight of ester acrylate copolymer (ethylacrylate-butylacrylate-acrylonitrile-acrylate-hydroxyethyl methacrylate copolymer, SG-708-6DR manufactured by Nagase Chemtex Corporation, Tg: 6° C., weight-average molecular weight: 500,000) serving as the ester (meth)acrylate copolymer, 28 parts by weight of phenoxy resin (JER1256, manufactured by Japan Epoxy Resins Co., Ltd., Mw: 50000) serving as the thermoplastic resin other than the ester (meth)acrylate copolymer, and 2 parts by weight of γ-glycidoxypropyl trimethoxysilane (KBM403E, manufactured by Shin-Etsu Chemical Co., Ltd.) serving as the coupling agent, were employed.

The evaluation was performed in the same way as with the Example 1, except for the difference in preparation of the resin varnish for the adhesive film.

Example 9

Preparation of Resin Varnish for Adhesive Film 100 parts by weight of ester acrylate copolymer (ethylacrylate-butylacrylate-acrylonitrile-acrylate-hydroxyethyl methacrylate copolymer, SG-708-6DR manufactured by Nagase Chemtex Corporation, Tg: 6° C., weight-average molecular weight: 500,000) serving as the ester (meth)acrylate copolymer, 10 parts by weight of phenoxy resin (Phenotohto YP-50 manufactured by Tohto Kasei Co., Ltd., Mw: 60000) serving as the thermoplastic resin other than the ester (meth)acrylate copolymer, 78 parts by weight of spherical silica (SE2050 manufactured by Admatechs Co., Ltd., average particle diameter 0.5 μm) serving as the inorganic filler, and 2 parts by weight of γ-glycidoxypropyl trimethoxysilane (KBM403E, manufactured by Shin-Etsu Chemical Co., Ltd.) serving as the coupling agent, were employed.

The evaluation was performed in the same way as with the Example 1, except for the difference in preparation of the resin varnish for the adhesive film.

Example 10

Preparation of Resin Varnish for Adhesive Film 100 parts by weight of ester acrylate copolymer (ethylacrylate-butylacrylate-acrylonitrile-acrylate-hydroxyethyl methacrylate copolymer, SG-708-6DR manufactured by Nagase Chemtex Corporation, Tg: 6° C., weight-average molecular weight: 500,000) serving as the ester (meth)acrylate copolymer, 10 parts by weight of nitrilebutadiene rubber (NBR) (Nipol1042 manufactured by neon Corporation) serving as the thermoplastic resin other than the ester (meth)acrylate copolymer, 78 parts by weight of spherical silica (SE2050 manufactured by Admatechs Co., Ltd., average particle diameter 0.5 μm) serving as the inorganic filler, and 2 parts by weight of γ-glycidoxypropyl trimethoxysilane (KBM403E, manufactured by Shin-Etsu Chemical Co., Ltd.) serving as the coupling agent, were employed.

The evaluation was performed in the same way as with the Example 1, except for the difference in preparation of the resin varnish for the adhesive film.

Example 11

Preparation of Resin Varnish for Adhesive Film 100 parts by weight of ester acrylate copolymer (ethylacrylate-butylacrylate-acrylonitrile-acrylate-hydroxyethyl methacrylate copolymer, SG-708-6DR manufactured by Nagase Chemtex Corporation, Tg: 6° C., weight-average molecular weight: 500,000) serving as the ester (meth)acrylate copolymer, 10 parts by weight of phenoxy resin (JER1256, manufactured by Japan Epoxy Resins Co., Ltd., Mw: 50000) serving as the thermoplastic resin other than the ester (meth)acrylate copolymer, 78 parts by weight of aluminum oxide (AO509 manufactured by Admatechs Co., Ltd., average particle diameter 10 μm) serving as the inorganic filler, 2 parts by weight of γ-glycidoxypropyl trimethoxysilane (KBM403E, manufactured by Shin-Etsu Chemical Co., Ltd.) serving as the coupling agent, were employed.

The evaluation was performed in the same way as with the Example 1, except for the difference in preparation of the resin varnish for the adhesive film.

Comparative Example 1

Preparation of Resin Varnish for Adhesive Film 100 parts by weight of ester acrylate copolymer (ethylacrylate-butylacrylate-acrylonitrile-acrylate-hydroxyethyl methacrylate copolymer, SG-708-6DR manufactured by Nagase Chemtex Corporation, Tg: 6° C., weight-average molecular weight: 500,000) serving as the ester (meth)acrylate copolymer, 10 parts by weight of phenoxy resin (JER1256, manufactured by Japan Epoxy Resins Co., Ltd., Mw: 50000) serving as the thermoplastic resin other than the ester (meth)acrylate copolymer, 78 parts by weight of spherical silica (SE2050 manufactured by Admatechs Co., Ltd., average particle diameter 0.5 μm) serving as the inorganic filler, 1 parts by weight of γ-glycidoxypropyl trimethoxysilane (KBM403E, manufactured by Shin-Etsu Chemical Co., Ltd.) serving as the coupling agent, 1 parts by weight of phenol resin (PR-HF-3 manufactured by Sumitomo Bakelite Co., Ltd., hydroxyl group equivalent 104 g/OH group), and 10 parts by weight of orthocresol novolac type epoxy resin (EOCN-1020-80 manufactured by Nippon Kayaku Co., Ltd., epoxy equivalent 200 g/eq) serving as the epoxy resin, were employed.

The evaluation was performed in the same way as with the Example 1, except for the difference in preparation of the resin varnish for the adhesive film.

Comparative Example 2

Preparation of Resin Varnish for Adhesive Film 100 parts by weight of ester acrylate copolymer (ethylacrylate-butylacrylate-acrylonitrile-acrylate-hydroxyethyl methacrylate copolymer, SG-708-6DR manufactured by Nagase Chemtex Corporation, Tg: 6° C., weight-average molecular weight: 500,000) serving as the ester (meth)acrylate copolymer, 78 parts by weight of spherical silica (SE2050 manufactured by Admatechs Co., Ltd., average particle diameter 0.5 μm) serving as the inorganic filler, and 2 parts by weight of γ-glycidoxypropyl trimethoxysilane (KBM403E, manufactured by Shin-Etsu Chemical Co., Ltd.) serving as the coupling agent, were employed.

The evaluation was performed in the same way as with the Example 1, except for the difference in preparation of the resin varnish for the adhesive film.

The mixture ratio and the evaluation result of the resin varnish for the adhesive film prepared according to the Examples and the Comparative examples are shown in Table 1. In Table 1, the mixture ratio of each component is indicated by parts by weight.

TABLE 1

| | | EXAMPLE 1 | EXAMPLE 2 | EXAMPLE 3 | EXAMPLE 4 | EXAMPLE 5 |
|---|---|---|---|---|---|---|
| ESTER (METH)ACRYLATE COPOLYMER(A) | SG-708-6DR (ESTER ACRYLATE COPOLYMER) | 100 | 100 | 100 | 100 | 100 |
| | SG-80HDR (ESTER ACRYLATE COPOLYMER) | | | | | |
| THERMOPLASTIC RESIN OTHER THAN ESTER (METH)ACRYLATE COPOLYMER(B) | JER1256 | 10 | 10 | 30 | 0.5 | 10 |
| | YP-50 | | | | | |
| | Nipol1042 | | | | | |
| INORGANIC FILLER(C) | SE2050 | 78 | 78 | 78 | 78 | 78 |
| | AO509 | | | | | |
| COUPLING AGENT(D) | KBM403E | 2 | 2 | 2 | 2 | 2 |
| PHENOL RESIN(E) | PR-HF-3 | 10 | | | | 4 |
| EPOXY RESIN(F) | EOCN-1020-80 | | | | | 6 |
| EVALUATION ON ADHESIVE FILM | γ AT 175° C. AFTER 10 MINUTES AT 175° C. | 0.19 | 0.17 | 0.28 | 0.20 | 0.28 |
| | γ AT 175° C. AFTER 2 HOURS AT 175° C. | 0.16 | 0.15 | 0.17 | 0.15 | 0.10 |
| | DIE SHEAR STRENGTH(MPa) | 2.5 | 2.3 | 1.9 | 2.8 | 2.9 |
| EVALUATION ON SEMICONDUCTOR DEVICE | FILLING PERFORMANCE IN INTERCONNECT SUBSTRATE LEVEL GAP AFTER 10 MINUTES AT 175° C. | aa | aa | aa | bb | aa |
| | FILLING PERFORMANCE IN INTERCONNECT SUBSTRATE LEVEL GAP AFTER 2 HOURS AT 175° C. | aa | aa | aa | aa | bb |
| | CRACK RESISTANCE OF SAMPLES AFTER 10 MINUTES AT 175° C. (NUMBER OF CRACKS/10) | 0/10 aa | 0/10 aa | 0/10 aa | 0/10 aa | 0/10 aa |
| | CRACK RESISTANCE OF SAMPLES AFTER 2 HOURS AT 175° C. (NUMBER OF CRACKS/10) | 0/10 aa | 0/10 aa | 0/10 aa | 0/10 aa | 0/10 aa |

| | | EXAMPLE 6 | EXAMPLE 7 | EXAMPLE 8 | EXAMPLE 9 | EXAMPLE 10 |
|---|---|---|---|---|---|---|
| ESTER (METH)ACRYLATE COPOLYMER(A) | SG-708-6DR (ESTER ACRYLATE COPOLYMER) | | 100 | 100 | 100 | 100 |
| | SG-80HDR (ESTER ACRYLATE COPOLYMER) | 100 | | | | |
| THERMOPLASTIC RESIN OTHER THAN ESTER (METH)ACRYLATE | JER1256 | 10 | 12 | 28 | | |
| | YP-50 | | | | 10 | |
| | Nipol1042 | | | | | 10 |

TABLE 1-continued

| COPOLYMER(B) | | | | | | | |
|---|---|---|---|---|---|---|---|
| INORGANIC FILLER(C) | SE2050 | 78 | 78 | | 78 | 78 | |
| | AO509 | | | | | | |
| COUPLING AGENT(D) | KBM403E | 2 | | 2 | 2 | 2 | |
| PHENOL RESIN(E) | PR-HF-3 | | | | | | |
| EPOXY RESIN(F) | EOCN-1020-80 | | | | | | |
| EVALUATION ON ADHESIVE FILM | γ AT 175° C. AFTER 10 MINUTES AT 175° C. | 0.18 | 0.19 | 0.30 | 0.22 | 0.21 | |
| | γ AT 175° C. AFTER 2 HOURS AT 175° C. | 0.13 | 0.16 | 0.23 | 0.18 | 0.11 | |
| | DIE SHEAR STRENGTH(MPa) | 1.8 | 1.7 | 2.0 | 2.2 | 1.7 | |
| EVALUATION ON SEMICONDUCTOR DEVICE | FILLING PERFORMANCE IN INTERCONNECT SUBSTRATE LEVEL GAP AFTER 10 MINUTES AT 175° C. | aa | aa | bb | aa | bb | |
| | FILLING PERFORMANCE IN INTERCONNECT SUBSTRATE LEVEL GAP AFTER 2 HOURS AT 175° C. | aa | aa | aa | aa | bb | |
| | CRACK RESISTANCE OF SAMPLES AFTER 10 MINUTES AT 175° C. (NUMBER OF CRACKS/10) | 0/10 aa | 0/10 aa | 0/10 aa | 0/10 aa | 0/10 aa | |
| | CRACK RESISTANCE OF SAMPLES AFTER 2 HOURS AT 175° C. (NUMBER OF CRACKS/10) | 0/10 aa | 0/10 aa | 0/10 aa | 0/10 aa | 0/10 aa | |

| | | EXAMPLE 11 | COMPARATIVE EXAMPLE 1 | COMPARATIVE EXAMPLE 2 |
|---|---|---|---|---|
| ESTER (METH)ACRYLATE COPOLYMER(A) | SG-708-6DR (ESTER ACRYLATE COPOLYMER) | 100 | 100 | 100 |
| | SG-80HDR (ESTER ACRYLATE COPOLYMER) | | | |
| THERMOPLASTIC RESIN OTHER THAN ESTER (METH)ACRYLATE COPOLYMER(B) | JER1256 | 10 | 10 | |
| | YP-50 | | | |
| | Nipol1042 | | | |
| INORGANIC FILLER(C) | SE2050 | | 78 | 78 |
| | AO509 | 78 | | |
| COUPLING AGENT(D) | KBM403E | 2 | 1 | 2 |
| PHENOL RESIN(E) | PR-HF-3 | | 1 | |
| EPOXY RESIN(F) | EOCN-1020-80 | | 10 | |
| EVALUATION ON ADHESIVE FILM | γ AT 175° C. AFTER 10 MINUTES AT 175° C. | 0.17 | 0.10 | 0.41 |
| | γ AT 175° C. AFTER 2 HOURS AT 175° C. | 0.12 | 0.06 | 0.25 |
| | DIE SHEAR STRENGTH(MPa) | 1.9 | 3.0 | 1.5 |
| EVALUATION ON SEMICONDUCTOR DEVICE | FILLING PERFORMANCE IN INTERCONNECT SUBSTRATE LEVEL GAP AFTER 10 MINUTES AT 175° C. | aa | bb | dd |
| | FILLING PERFORMANCE IN INTERCONNECT SUBSTRATE LEVEL GAP AFTER 2 HOURS AT 175° C. | bb | dd | bb |
| | CRACK RESISTANCE OF SAMPLES AFTER 10 MINUTES AT 175° C. (NUMBER OF CRACKS/10) | 0/10 aa | 0/10 aa | 10/10 dd |
| | CRACK RESISTANCE OF SAMPLES AFTER 2 HOURS AT 175° C. (NUMBER OF CRACKS/10) | 0/10 aa | 10/10 dd | 5/10 dd |

The invention claimed is:

1. An adhesive film for a semiconductor to be used for stacking semiconductor chips in two or more layers, comprising:

(A) an ester (meth)acrylate copolymer; and
(B) a thermoplastic resin other than said ester (meth)acrylate copolymer;

said adhesive film for a semiconductor have a shearing strain γ satisfying the following formula (1) for two hours from 10 minutes after starting measurement, in which the shearing strain γ represents an amount of shearing strain produced upon undergoing a shearing stress of 3000 Pa at a frequency of 1 Hz and a temperature of 175° C., on parallel plates of 20 mm in diameter:

$$0.10 \leq \gamma \leq 0.30 \qquad (1)$$

wherein the adhesive film is substantially free from a thermosetting resin.

2. The adhesive film for a semiconductor according to claim 1, wherein said (B) thermoplastic resin other than said ester (meth)acrylate copolymer is a phenoxy resin.

3. The adhesive film for a semiconductor according to claim 1,
wherein said (A) ester (meth)acrylate copolymer contains a monomer unit having a carboxyl group.

4. The adhesive film for a semiconductor according to claim 1,
wherein an added amount of said (B) thermoplastic resin other than said ester (meth)acrylate copolymer is equal to or more than 0.5 parts by weight and equal to or less than 30 parts by weight, with respect to 100 parts by weight of said (A) ester (meth)acrylate copolymer.

5. The adhesive film for a semiconductor according to claim 1, further comprising (C) an inorganic filler.

6. The adhesive film for a semiconductor according to claim 5, wherein said (C) inorganic filler is silica.

7. The adhesive film for a semiconductor according to claim 5, wherein an added amount of said (C) inorganic filler is equal to or more than 5 parts by weight and equal to or less than 100 parts by weight, with respect to 100 parts by weight of resin composition other than said (C) inorganic filler.

8. The adhesive film for a semiconductor according to claim 1, further comprising (D) a coupling agent.

9. The adhesive film for a semiconductor according to claim 8, wherein an added amount of said (D) coupling agent is equal to or more than 0.01 parts by weight and equal to or less than 10 parts by weight, with respect to 100 parts by weight of resin composition.

10. The adhesive film for a semiconductor according to claim 1, being configured so as to serve as a dicing sheet.

11. A semiconductor device comprising semiconductor chips stacked in two or more layers with the adhesive film for a semiconductor according to claim 1.

* * * * *